US010427972B2

(12) United States Patent
Luo et al.

(10) Patent No.: US 10,427,972 B2
(45) Date of Patent: Oct. 1, 2019

(54) TRANSPARENT SILICATE GLASSES WITH HIGH FRACTURE TOUGHNESS

(71) Applicant: CORNING INCORPORATED, Corning, NY (US)

(72) Inventors: Jian Luo, Painted Post, NY (US); John Christopher Mauro, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 77 days.

(21) Appl. No.: 15/650,152

(22) Filed: Jul. 14, 2017

(65) Prior Publication Data

US 2018/0022635 A1 Jan. 25, 2018

Related U.S. Application Data

(60) Provisional application No. 62/365,049, filed on Jul. 21, 2016.

(51) Int. Cl.
| | | |
|---|---|---|
| C03C 3/097 | (2006.01) | |
| C03C 3/095 | (2006.01) | |
| C03B 1/00 | (2006.01) | |
| H05K 5/03 | (2006.01) | |

(52) U.S. Cl.
CPC ............ *C03C 3/097* (2013.01); *C03B 1/00* (2013.01); *C03C 3/095* (2013.01); *H05K 5/03* (2013.01)

(58) Field of Classification Search
CPC .............................. C03C 3/095; C03C 3/097
See application file for complete search history.

(56) References Cited

U.S. PATENT DOCUMENTS

| | | | |
|---|---|---|---|
| 2,805,166 A | 9/1957 | Loffler et al. | |
| 3,513,004 A | 5/1970 | Kohut et al. | |
| 3,615,769 A | 10/1971 | Leitz et al. | |
| 3,804,646 A | 4/1974 | Dumbaugh, Jr. | |
| 7,659,222 B2 | 2/2010 | Shimizu | |
| 8,361,917 B2 | 1/2013 | Li et al. | |
| 2014/0141226 A1 | 5/2014 | Bookbinder et al. | |
| 2014/0376868 A1* | 12/2014 | Ritter | C03C 13/046 385/123 |

FOREIGN PATENT DOCUMENTS

| | | | |
|---|---|---|---|
| DE | 4222322 C1 | 12/1993 | |
| JP | 52014607 A | 2/1977 | |
| JP | 60221338 A | 11/1985 | |

OTHER PUBLICATIONS

Machine Translation of JP S 52-14607 A, 1977 (Year: 1977).*
Machine Translation of JP S 60-221338 A (Year: 1985).*
Bubsey et al; Closed-Form Expressions for Crack-Mouth Displacements and Stress Intensity Factors for Chevron-Notched Short Bar and Short Rod Specimens Based on Experimental Compliance Measurements; NASA Technical Memorandum 83796; Oct. 1992; 34 Pages.
Darwent; "Bond Dissociation Energies in Simple Molecules"; Nat. Stand. Ref. Data. Ser., Nat. Bur. Stand. (U.S.) 31, 52 Jan. 1970; 60 Pages.
Pan et al; "Therman, Mechanical, and Upconversion Properties of Er3+/Yb3+ Co-Doped Titanate Glass Prepared by Levitation Method"; Journal of Alloys and Compounds 509, 7504-7507, (2011).
Reddy et al; "Fracture Thoughness Measurements of Glass and Ceramic Materials Using Chevron-Notched Specimens"; J. Am. Ceram. Soc., 71 (6) C-310-C-313 (1988).
Shelby RT Al; "Rare-Earth Aluminosilicate Glasses"; Journal of the American Ceramic Society 73, 39-42, (1990).
Shi et al; "Intrinsic Ductility of Glassy Solids"; Journal of Applied Physics; 115, 043528-1-043528-17 (2014).
Tarafder et al; "Nanostructuring and Fluorescence Properites of Eu3+:LiTaO3 in Li2O—Ta2O5—SiO2—Al2O3 Glass-Ceramics"; Journal of Materials Science 44, 4495-4498, (2009).
Zhang et al; A Novel Upconversion TiO2—La2O3—Ta2O5 Bulk Glass Co-Doped With Er3+/Yb3+ Fabricated by Containerless Processing; Materials Letters 66, 367-369, (2012).
International Search Report and Written Opinion PCT/US2017/042706 dated Nov. 7, 2017.

* cited by examiner

*Primary Examiner* — Elizabeth A. Bolden
(74) *Attorney, Agent, or Firm* — Timothy M. Schaeberle

(57) ABSTRACT

Provided herein are glass based articles comprising $SiO_2$, $Al_2O_3$, and two or more metal oxides selected from the group consisting of $La_2O_3$, $BaO$, $Ta_2O_5$, $Y_2O_3$, and $HfO_2$. The glass based articles typically are characterized by a high fracture toughness (e.g., at least 0.86 $MPa*m^{0.5}$), a high Young's modulus value (e.g., at least 85 GPa) and/or a stress optical coefficient (SOC) of not more than 3 Brewster (e.g., about 1.3 Brewster to about 2 Brewster). Also provided herein are glass based articles comprising $SiO_2$ and two or more of $M_xO_y$, wherein M is Ba, La, Ta, Y, Al or Hf; wherein the total amount of $SiO_2$ is the same or substantially the same as that of a reference glass based article comprising two or more binary compositions of $M_xO_y$—$SiO_2$, wherein the reference glass based article has the same molar percentage of each $M_xO_y$, and the molar ratio of $M_xO_y$ to $SiO_2$ in each binary composition is $4/(c*x)$, wherein c is the number of charges of M.

19 Claims, 2 Drawing Sheets

TRANSPARENT SILICATE GLASSES WITH HIGH FRACTURE TOUGHNESS

CROSS-REFERENCE TO RELATED APPLICATIONS

This application claims the benefit of priority of U.S. Application Ser. No. 62/365,049 filed on Jul. 21, 2016 the content of which is relied upon and incorporated herein by reference in its entirety.

FIELD AND BACKGROUND

The present disclosure is generally related to novel glass based articles.

Glass is a brittle material which can sometimes break during use. The fracture toughness of commercially used glasses is usually close to or below 0.8 MPa*m$^{0.5}$. There are continued desires to obtain glasses, such as transparent glasses, with high fracture toughness to improve damage resistance and/or drop performance.

BRIEF SUMMARY

In various embodiments, the present disclosure provides a glass based article comprising one or more metal oxides selected from the group consisting of $La_2O_3$, BaO, $Ta_2O_5$, $Y_2O_3$, and $HfO_2$. In some embodiments, the glass based article comprises $SiO_2$, $Al_2O_3$, and two or more metal oxides selected from the group consisting of $La_2O_3$, BaO, $Ta_2O_5$, $Y_2O_3$, and $HfO_2$. In some embodiments, the glass based article comprises $SiO_2$ in the range of about 35 mol % to about 80 mol %. In some embodiments, the glass based article comprises $Al_2O_3$ in the range of about 1 mol % to about 15 mol %. In some embodiments, the two or more metal oxides are selected from the group consisting of $La_2O_3$, BaO, $Ta_2O_5$, $Y_2O_3$, and $HfO_2$, wherein the combined molar percentages of the two or more metal oxides are at least 15 mol %. In some embodiments, the glass based article comprises $HfO_2$ in the range of about 1 mol % to about 7 mol %; $Y_2O_3$ in the range of about 1 mol % to about 29 mol %; $Ta_2O_5$ in the range of about 1 mol % to about 30 mol %; $La_2O_3$ in the range of about 1 mol % to about 29 mol %; and/or BaO in the range of about 1 mol % to about 33 mol %. In any of the embodiments described herein, the glass based article can comprise not more than 5 mol % (e.g., not more than 3 mol %, not more than 2 mol %, not more than 1 mol %, not more than 0.5 mol %, or not more than 0.1 mol %) of alkali metals and/or boron. In some embodiments, the glass based article is included in a consumer electronic device, for example, as a cover glass.

In some embodiments, the glass based article comprises $SiO_2$, $Al_2O_3$, $La_2O_3$, BaO, $Ta_2O_5$, $Y_2O_3$, and $HfO_2$. In some embodiments, the glass based article consists or consists essentially of $SiO_2$, $Al_2O_3$, $La_2O_3$, BaO, $Ta_2O_5$, $Y_2O_3$, and $HfO_2$. For example, in some embodiments, the glass based article can comprise $SiO_2$ in the range of about 40 mol % to about 75 mol %; $Al_2O_3$ in the range of about 3 mol % to about 10 mol %; $La_2O_3$ in the range of about 2 mol % to about 25 mol %; $Ta_2O_5$ in the range of about 2 mol % to about 20 mol %; $Y_2O_3$ in the range of about 2 mol % to about 21 mol %; $HfO_2$ in the range of about 1.5 mol % to about 6 mol %; and BaO in the range of about 2 mol % to about 25 mol %. In other embodiments, the glass based article can comprise $SiO_2$ in the range of about 45 mol % to about 70 mol %; $Al_2O_3$ in the range of about 4 mol % to about 9 mol %; $La_2O_3$ in the range of about 4 mol % to about 22 mol %; $Ta_2O_5$ in the range of about 2.5 mol % to about 18 mol %; $Y_2O_3$ in the range of about 4 mol % to about 21 mol %; $HfO_2$ in the range of about 2 mol % to about 5 mol %; and BaO in the range of about 4 mol % to about 25 mol %.

The glass based article described herein can be characterized by certain properties. For example, in some embodiments, the glass based article can be characterized by having (i) a fracture toughness of at least 0.86 MPa*m$^{0.5}$ (e.g., about 1 MPa*m$^{0.5}$ to about 1.6 MPa*m$^{0.5}$); (ii) a Young's modulus value of at least 85 GPa (e.g., about 110 GPa to about 140 GPa); and/or (iii) a stress optical coefficient (SOC) of not more than 3 Brewster (e.g., about 1.3 Brewster to about 2 Brewster).

Certain embodiments of the present disclosure are directed to a glass based article characterized by high fracture toughness. In some embodiments, the glass based article comprises $SiO_2$, $Al_2O_3$, and two or more metal oxides selected from the group consisting of $La_2O_3$, BaO, $Ta_2O_5$, $Y_2O_3$, and $HfO_2$, wherein the glass based article is characterized by a fracture toughness of at least 0.86 MPa*m$^{0.5}$. In some embodiments, the glass based article comprises not more than 5 mol % (e.g., not more than 3 mol %, not more than 2 mol %, not more than 1 mol %, not more than 0.5 mol %, or not more than 0.1 mol %) of alkali metals and/or boron. In some embodiments, the two or more metal oxides comprise $La_2O_3$, BaO, $Ta_2O_5$, $Y_2O_3$, and $HfO_2$. In some embodiments, the glass based article has a fracture toughness of about 1.0 MPa*m$^{0.5}$ to about 1.6 MPa*m$^{0.5}$. In some embodiments, the glass based article can be further characterized by having a Young's modulus value of at least 85 GPa (e.g., about 110 GPa to about 140 GPa); and/or a stress optical coefficient (SOC) of not more than 3 Brewster (e.g., about 1.3 Brewster to about 2 Brewster).

In some embodiments, this disclosure also provides a glass based article comprising $SiO_2$ and two or more oxides of $M_xO_y$, with certain concentration requirements, wherein M is Ba, La, Ta, Y, Al or Hf. In some embodiments, the two or more oxides of $M_xO_y$ are selected from the group consisting of $Al_2O_3$, $La_2O_3$, BaO, $Ta_2O_5$, $Y_2O_3$, and $HfO_2$. In some embodiments, the concentrations of the oxides in the glass based article satisfies a relationship such that the combined molar percentage of $SiO_2$ is the same or substantially the same (e.g., within 95%, within 90%, within 85%, or within 80%) as that of a reference glass based article comprising two or more binary compositions of $M_xO_y$—$SiO_2$, wherein the reference glass based article has the same molar percentage of each $M_xO_y$, and the molar ratio of $M_xO_y$ to $SiO_2$ in each binary composition is 4/(c*x), wherein c is the number of charges of M. In some embodiments, the two or more oxides of $M_xO_y$ are $Al_2O_3$, $La_2O_3$, BaO, $Ta_2O_5$, $Y_2O_3$, and $HfO_2$.

In some embodiments, a process of preparing the glass based article is also provided. In some embodiments, the method comprises mixing and heating individual oxides according to their respective molar percentages in the glass based article. In some embodiments, the method comprises mixing two or more binary compositions of $M_xO_y$—$SiO_2$, wherein M is Ba, La, Ta, Y, Al or Hf; and heating the two or more binary compositions of $M_xO_y$—$SiO_2$ to form the glass based article, wherein each binary composition is characterized by a molar ratio of $SiO_2$ to $M_xO_y$ of 1:4/(c*x), wherein c is the number of charges of M. In some embodiments, the two or more binary compositions of $M_xO_y$—$SiO_2$ comprise BaO—$SiO_2$, $La_2O_3$—$SiO_2$, $Ta_2O_5$—$SiO_2$, $Y_2O_3$—$SiO_2$, $Al_2O_3$—$SiO_2$ and $HfO_2$—$SiO_2$. In some embodiments, the $SiO_2$ is in a total amount of about 30 mol % to about 80 mol %.

BRIEF DESCRIPTION OF THE FIGURES

The foregoing summary, as well as the following detailed description of the embodiments, will be better understood when read in conjunction with the appended figures. For the purpose of illustration, the figures may describe the use of specific embodiments. It should be understood, however, that the compositions and methods described herein are not limited to the precise embodiments discussed or described in the figures.

DETAILED DESCRIPTION OF THE INVENTION

Definitions

Figure 1A:
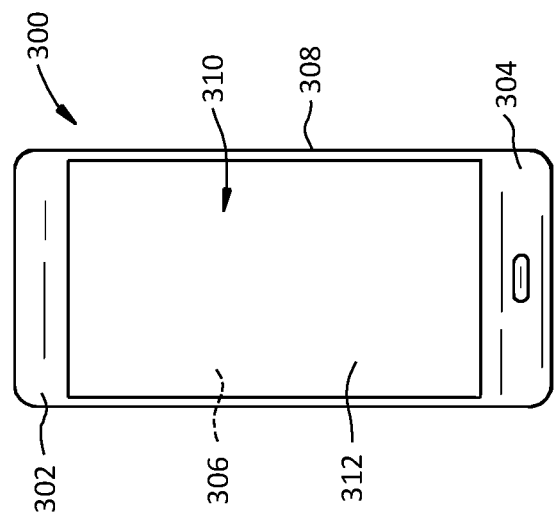
FIG. 1A is a plan view of an exemplary electronic device incorporating any of the glass based articles disclosed herein.

Open terms such as "include," "including," "contain," "containing" and the like mean "comprising." These open-ended transitional phrases are used to introduce an open ended list of elements, method steps or the like that does not exclude additional, unrecited elements or method steps. It is understood that wherever embodiments are described with the language "comprising," otherwise analogous embodiments described in terms of "consisting of" and/or "consisting essentially of" are also provided.

The transitional phrase "consisting of" and variations thereof excludes any element, step, or ingredient not recited, except for impurities ordinarily associated therewith.

The transitional phrase "consists essentially of," or variations such as "consist essentially of" or "consisting essentially of" excludes any element, step, or ingredient not recited except for those that do not materially change the basic or novel properties of the specified method, structure or composition.

Also, the indefinite articles "a" and "an" preceding an element or component of the disclosure are intended to be nonrestrictive regarding the number of instances, i.e., occurrences of the element or component. Therefore "a" or "an" should be read to include one or at least one, and the singular word form of the element or component also includes the plural unless the number is obviously meant to be singular.

As used herein, the term "about" modifying a value related to the disclosure refers to variation in the numerical quantity that can occur, for example, through routine testing and handling; through inadvertent error in such testing and handling; through differences in the manufacture, source, or purity of ingredients employed in the disclosure; and the like. Whether or not modified by the term "about", the claims include equivalents of the recited quantities. In one embodiment, the term "about" means within 10% of the reported numerical value.

The terms "disclosure" or "present disclosure" as used herein are non-limiting terms and are not intended to refer to any single embodiment of the particular disclosure but encompass all possible embodiments as described in the application.

As used herein, the terms "glass based article" and "glass based articles" are used in their broadest sense to include any object made wholly or partly of glass. In some embodiments, the glass or glass ceramic substrate(s) and/or the glass based article(s) can have an amorphous phase and one or more crystalline phases.

Whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any sub-ranges therebetween. Unless otherwise specified, all compositions and relationships that include constituents of compositions described herein are expressed in mole percent (mol %) on a metal oxide basis.

Glass Compositions

In various embodiments, the present disclosure provides a glass based article comprising one or more metal oxides selected from the group consisting of $La_2O_3$, $BaO$, $Ta_2O_5$, $Y_2O_3$, and $HfO_2$. In some embodiments, the glass based article comprises $SiO_2$, $Al_2O_3$, and two or more metal oxides selected from the group consisting of $La_2O_3$, $BaO$, $Ta_2O_5$, $Y_2O_3$, and $HfO_2$. In some embodiments, the glass based article comprises $SiO_2$, $Al_2O_3$, $La_2O_3$, $BaO$, $Ta_2O_5$, $Y_2O_3$, and $HfO_2$. In some embodiments, the glass based article comprises not more than 5 mol % (e.g., not more than 3 mol %, not more than 2 mol %, not more than 1 mol %, not more than 0.5 mol %, or not more than 0.1 mol %) of alkali metals such as $Li^+$, $Na^+$, $K^+$, etc. In some embodiments, the glass based article has not more than 5 mol % (e.g., not more than 3 mol %, not more than 2 mol %, not more than 1 mol %, not more than 0.5 mol %, or not more than 0.1 mol %) of boron. As used herein, alkali metal includes all forms of alkali metal that can exist in a glass based composition, such as alkali metal oxides. Similarly, as used herein, boron includes all forms of boron that can exist in a glass based composition, such as boron oxides. In some embodiments, the glass based article consists of or consisting essentially of $SiO_2$, $Al_2O_3$, and metal oxides (e.g., 1, 2, 3, 4, or 5 metal oxides) selected from the group consisting of $La_2O_3$, $BaO$, $Ta_2O_5$, $Y_2O_3$, and $HfO_2$. In some embodiments, the glass based article consists of or consisting essentially of $SiO_2$, $Al_2O_3$, $La_2O_3$, $BaO$, $Ta_2O_5$, $Y_2O_3$, and $HfO_2$.

The glass based article described herein can include various amount of silica, or $SiO_2$. While not wishing to be bound by theories, it is believed that $SiO_2$ is the primary glass forming oxide, which forms the network backbone for the glass. Pure $SiO_2$ is incompatible with most manufacturing processes owing to its extremely high melting temperature. Since the viscosity of pure $SiO_2$ or high-$SiO_2$ glasses is too high in the melting region, defects such as fining bubbles may appear, and erosion of refractories and degradation of platinum may become too extreme to permit long-term manufacturing in a continuous process. Furthermore, as silica concentration increases, the liquidus temperature may increase due to increasing stability of cristobalite, a crystalline polymorph of $SiO_2$ that is an undesirable devitrification phase in a continuous process. However, a minimum level of $SiO_2$ is required to ensure good chemical durability and compatibility with refractory materials used in manufacturing. Those skilled in the art could adjust the amount of $SiO_2$ in view of this disclosure.

In the glass based articles of this disclosure, the concentration of $SiO_2$ typically ranges between about 35 mol % and about 80 mol % (e.g., about 35 mol %, about 40 mol %, about 45 mol %, about 50 mol %, about 55 mol %, about 60 mol %, about 65 mol %, about 70 mol %, about 75 mol %, about 80 mol %, or any ranges between the specified values). For example, in some embodiments, the concentration of $SiO_2$ ranges between about 40 mol % and about 75 mol %. In some embodiments, the concentration of $SiO_2$ ranges between about 45 mol % and about 70 mol %.

The glass based article described herein typically includes aluminum oxide, or $Al_2O_3$. While not wishing to be bound by theories, it is believed that $Al_2O_3$ can also serves as a glass former. Like $SiO_2$, $Al_2O_3$ can also contribute rigidity to the glass network due to its tetrahedral coordination. Similarly, an increase in $Al_2O_3$ content relative to other glass modifier oxides generally results in decreased density, decreased coefficient of thermal expansion, and improved durability. However, the concentration of $Al_2O_3$ cannot be too high. For example, when the concentration is too high, $Al_2O_3$ can promote the dissolution of zircon refractory material, which can lead to fusion line zirconia defects, and can lead to a softening point that is unfavorably high for 3D glass forming. Thus, the amounts of $Al_2O_3$ are adjusted to balance these various properties.

In the glass based articles of this disclosure, the concentration of $Al_2O_3$ typically ranges between about 1 mol % and about 15 mol % (e.g., about 1 mol %, about 2 mol %, about 3 mol %, about 4 mol %, about 5 mol %, about 6 mol %, about 7 mol %, about 8 mol %, about 9 mol %, about 10 mol %, about 11 mol %, about 12 mol %, about 13 mol %, about 14 mol %, about 15 mol %, or any ranges between the specified values). For example, in some embodiments, the concentration of $Al_2O_3$ ranges between about 3 mol % and about 10 mol %. In some embodiments, the concentration of $Al_2O_3$ ranges between about 4 mol % and about 9 mol %.

In some embodiments, the glass based article described herein also includes two or more metal oxides selected from the group consisting of $La_2O_3$, BaO, $Ta_2O_5$, $Y_2O_3$, and $HfO_2$. For example, the two or more metal oxides can be $La_2O_3$ and BaO; $La_2O_3$ and $Ta_2O_5$; $La_2O_3$ and $Y_2O_3$; $La_2O_3$ and $HfO_2$; BaO and $Ta_2O_5$; BaO and $Y_2O_3$; BaO and $HfO_2$; $Ta_2O_5$ and $Y_2O_3$; $Ta_2O_5$ and $HfO_2$; $Y_2O_3$ and $HfO_2$; $La_2O_3$, BaO and $Ta_2O_5$; $La_2O_3$, BaO and $Y_2O_3$; $La_2O_3$, BaO and $HfO_2$; $La_2O_3$, $Ta_2O_5$ and $Y_2O_3$; $La_2O_3$, $Ta_2O_5$ and $HfO_2$; $La_2O_3$, $Y_2O_3$, and $HfO_2$; BaO, $Ta_2O_5$ and $Y_2O_3$; BaO, $Ta_2O_5$ and $HfO_2$; BaO, $Y_2O_3$ and $HfO_2$; $Ta_2O_5$, $Y_2O_3$ and $HfO_2$; $La_2O_3$, BaO, $Ta_2O_5$ and $Y_2O_3$; $La_2O_3$, BaO, $Ta_2O_5$ and $HfO_2$; $La_2O_3$, $Ta_2O_5$, $Y_2O_3$, and $HfO_2$; BaO, $Ta_2O_5$, $Y_2O_3$, and $HfO_2$; or $La_2O_3$, BaO, $Ta_2O_5$, $Y_2O_3$, and $HfO_2$. Suitable concentrations of the metal oxides are described herein.

In some embodiments, the combined molar percentages of the two or more metal oxides can be at least 15 mol % (e.g., at least 20 mol %, at least 25 mol %, at least 30 mol %, at least 35 mol %, at least 40 mol %, at least 45 mol %, at least 50 mol %, at least 55 mol %, or at least 60 mol %). In some embodiments, the combined molar percentages of the two or more metal oxides are about 15 mol %, about 20 mol %, about 25 mol %, about 30 mol %, about 35 mol %, about 40 mol %, about 45 mol %, about 50 mol %, about 55 mol %, about 60 mol %, or any ranges between the specified values.

In some embodiments, the glass based article described herein comprises Lanthanum oxide, or $La_2O_3$. While not wishing to be bound by theories, it is believed that $La_2O_3$ is important to increase the bonding strength and reduce the angular constraint. However too high concentration of $La_2O_3$ can increase the melting temperature and render the composition incompatible with most manufacturing processes. In the glass based articles of this disclosure, the concentration of $La_2O_3$ typically ranges between about 1 mol % and about 29 mol % (e.g., about 1 mol %, about 2 mol %, about 4 mol %, about 6 mol %, about 8 mol %, about 10 mol %, about 12 mol %, about 14 mol %, about 16 mol %, about 18 mol %, about 20 mol %, about 22 mol %, about 24 mol %, about 26 mol %, about 28 mol %, about 29 mol %, or any ranges between the specified values). In some embodiments, the concentration of $La_2O_3$ ranges between about 2 mol % and about 25 mol %. In some embodiments, the concentration of $La_2O_3$ ranges between about 4 mol % and about 22 mol %. Those skilled in the art could adjust the amount of $La_2O_3$ in view of this disclosure.

In some embodiments, the glass based article described herein comprises Tantalum oxide, or $Ta_2O_5$. $Ta_2O_5$ has strong oxygen bonding energy and relatively low angular constraint. While not wishing to be bound by theories, it is believed that $Ta_2O_5$ can increase the tendency of crystallization and melting temperature. In some embodiments, $Ta_2O_5$ is not the only major oxides in the mixture. Typically, the concentration of $Ta_2O_5$ in the glass based article described herein can range from about 1 mol % to about 30 mol % (e.g., e.g., about 1 mol %, about 2 mol %, about 4 mol %, about 6 mol %, about 8 mol %, about 10 mol %, about 12 mol %, about 14 mol %, about 16 mol %, about 18 mol %, about 20 mol %, about 22 mol %, about 24 mol %, about 26 mol %, about 28 mol %, about 30 mol %, or any ranges between the specified values). In some embodiments, the concentration of $Ta_2O_5$ ranges between about 2 mol % and about 20 mol %. In some embodiments, the concentration of $Ta_2O_5$ ranges between about 2.5 mol % and about 18 mol %. Those skilled in the art could adjust the amount of $Ta_2O_5$ in view of this disclosure.

In some embodiments, the glass based article described herein comprises Yttrium oxide, or $Y_2O_3$. In the glass based articles of this disclosure, the concentration of $Y_2O_3$ typically ranges between about 1 mol % and about 29 mol % (e.g., about 1 mol %, about 2 mol %, about 4 mol %, about 6 mol %, about 8 mol %, about 10 mol %, about 12 mol %, about 14 mol %, about 16 mol %, about 18 mol %, about 20 mol %, about 22 mol %, about 24 mol %, about 26 mol %, about 28 mol %, about 29 mol %, or any ranges between the specified values). In some embodiments, the concentration of $Y_2O_3$ ranges between about 2 mol % and about 21 mol %. In some embodiments, the concentration of $Y_2O_3$ ranges between about 4 mol % and about 21 mol %. Those skilled in the art could adjust the amount of $Y_2O_3$ in view of this disclosure.

In some embodiments, the glass based article described herein comprises Hafnium oxide, or $HfO_2$. In the glass based articles of this disclosure, the concentration of $HfO_2$ typically ranges between 1 mol % and about 7 mol % (e.g., about 1 mol %, about 2 mol %, about 3 mol %, about 4 mol %, about 5 mol %, about 6 mol %, about 7 mol %, or any ranges between the specified values). In some embodiments, the concentration of $HfO_2$ ranges between about 1.5 mol % and about 6 mol %. In some embodiments, the concentration of $Y_2O_3$ ranges between about 2 mol % and about 5 mol %. Those skilled in the art could adjust the amount of $HfO_2$ in view of this disclosure.

In some embodiments, the glass based article described herein comprises Barium oxide, or BaO. In the glass based articles of this disclosure, the concentration of BaO typically ranges between about 1 mol % and about 33 mol % (e.g., about 1 mol %, about 2 mol %, about 4 mol %, about 6 mol %, about 8 mol %, about 10 mol %, about 12 mol %, about 14 mol %, about 16 mol %, about 18 mol %, about 20 mol %, about 22 mol %, about 24 mol %, about 26 mol %, about 28 mol %, about 30 mol %, about 33 mol %, or any ranges between the specified values). In some embodiments, the concentration of BaO ranges between about 2 mol % and about 25 mol %. In some embodiments, the concentration of BaO ranges between about 4 mol % and about 25 mol %. Those skilled in the art could adjust the amount of BaO in view of this disclosure.

In some particular embodiments, the glass based article comprises $SiO_2$, $Al_2O_3$, $La_2O_3$, BaO, $Ta_2O_5$, $Y_2O_3$, and $HfO_2$. In some embodiments, the glass based article consists or consists essentially of $SiO_2$, $Al_2O_3$, $La_2O_3$, BaO, $Ta_2O_5$, $Y_2O_3$, and $HfO_2$. For example, the glass based article can have the compositions according to Table 1 below (in molar percentages*):

TABLE 1

Compositions for Exemplary Glass Based Article

| Typical Range | Preferred Range | More Preferred Range |
|---|---|---|
| $35 \leq [SiO_2] \leq 80$ | $40 \leq [SiO_2] \leq 75$ | $45 \leq [SiO_2] \leq 70$ |
| $1 \leq [Al_2O_3] \leq 15$ | $3 \leq [Al_2O_3] \leq 10$ | $4 \leq [Al_2O_3] \leq 9$ |
| $1 \leq [La_2O_3] \leq 29$ | $2 \leq [La_2O_3] \leq 25$ | $4 \leq [La_2O_3] \leq 22$ |
| $1 \leq [Ta_2O_5] \leq 30$ | $2 \leq [Ta_2O_5] \leq 20$ | $2.5 \leq [Ta_2O_5] \leq 18$ |
| $1 \leq [Y_2O_3] \leq 29$ | $2 \leq [Y_2O_3] \leq 21$ | $4 \leq [Y_2O_3] \leq 21$ |
| $1 \leq [HfO_2] \leq 7$ | $1.5 \leq [HfO_2] \leq 6$ | $2 \leq [HfO_2] \leq 5$ |
| $1 \leq [BaO] \leq 33$ | $2 \leq [BaO] \leq 25$ | $4 \leq [BaO] \leq 25$ |

* Other suitable ranges are described herein, and all different combinations of suitable ranges are contemplated.

Properties of Glass Based Articles

The glassed based article described herein can have favorable properties. For example, in various embodiments, the glass based article exhibits high fracture toughness. In some embodiments, the glass based article exhibits a high Young's modulus value, which can lead to high hardness. In some embodiments, the glass based article exhibits a low stress optical coefficient (SOC). In any of the embodiments described herein, the glass based article can be substantially transparent in the visible spectrum.

Competitions between shear and cleavage govern the ductile/brittle behavior of materials. At the crack tip, if the energy or stress required for shear is lower than that for cleavage, crack tip will be blunted by shear and the material will exhibit ductility or high fracture toughness. At the atomic level, the brittle/ductile behavior of glasses can be governed by the competition between bonding strength and angular constraint in the glass network. A relative increase in bonding strength or a relative decrease in angular constraint can increase ductility by preventing cleavage or promoting shear deformation.

While not wishing to be bound by theories, it is believed that the glass based article described herein can achieve high fracture toughness through the elements (e.g., Ta, La, Y, Ba and Hf) that bond strongly to oxygen and in the meantime reduce the angular constraint. For example, the bonding energy of Ta—O is 810 KJ/mol, higher than the SiO bond strength. Since Ta is more metallic and less covalent than Si, the Ta—O bond also has a weaker angular constraint. The high binding energy and the less angular constraints of the metal oxide bonds such as Ta—O can therefore intrinsically improve damage resistance of glasses.

In various embodiments, this disclosure provides a glass based article characterized by a high fracture toughness. For example, in any of the embodiments described herein, the glass based article can have a fracture toughness values of at least 0.86 MPa*m$^{0.5}$ (e.g., at least 1 MPa*m$^{0.5}$, at least 1.5 MPa*m$^{0.5}$, or at least 2 MPa*m$^{0.5}$). In some embodiments, the glass based article can have a fracture toughness values of about 0.86 MPa*m$^{0.5}$, about 0.9 MPa*m$^{0.5}$, about 1 MPa*m$^{0.5}$, about 1.1 MPa*m$^{0.5}$, about 1.2 MPa*m$^{0.5}$, about 1.3 MPa*m$^{0.5}$, about 1.4 MPa*m$^{0.5}$, about 1.5 MPa*m$^{0.5}$, about 1.6 MPa*m$^{0.5}$, about 1.8 MPa*m$^{0.5}$, about 2 MPa*m$^{0.5}$, or any ranges between the specified values. For example, in some embodiments, the glass based article can have a fracture toughness values of about 0.86 MPa*m$^{0.5}$ to about 1.5 MPa*m$^{0.5}$. In some embodiments, the glass based article can have a fracture toughness values of about 1 MPa*m$^{0.5}$ to about 1.6 MPa*m$^{0.5}$. The fracture toughness value ($K_{1C}$) recited in this disclosure refers to a value as measured by chevron notched short bar (CNSB) method disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992).

In some embodiments, the glass based article characterized by the fracture toughness described herein comprises $SiO_2$, $Al_2O_3$, and two or more metal oxides selected from the group consisting of $La_2O_3$, BaO, $Ta_2O_5$, $Y_2O_3$, and $HfO_2$. Suitable concentrations of $SiO_2$, $Al_2O_3$, and the two or more metal oxides include any of those described herein. In some embodiments, the glass based article comprises not more than 5 mol % (e.g., not more than 3 mol %, not more than 2 mol %, not more than 1 mol %, not more than 0.5 mol %, or not more than 0.1 mol %) of alkali metals. In some embodiments, the glass based article comprises not more than 5 mol % (e.g., not more than 3 mol %, not more than 2 mol %, not more than 1 mol %, not more than 0.5 mol %, or not more than 0.1 mol %) of boron. In some embodiments, the glass based article comprises not more than 5 mol % (e.g., not more than 3 mol %, not more than 2 mol %, not more than 1 mol %, not more than 0.5 mol %, or not more than 0.1 mol %) of alkali metals and boron. In some embodiments, there are no alkali metals present in the glass based article. In some embodiments, there is no boron present in the glass based article. In some embodiments, there are no alkali metals and boron present in the glass based article. In some embodiments, the glass based article comprises $SiO_2$, $Al_2O_3$, $La_2O_3$, BaO, $Ta_2O_5$, $Y_2O_3$, and $HfO_2$. In some embodiments, the glass based article consists or consists essentially of $SiO_2$, $Al_2O_3$, $La_2O_3$, BaO, $Ta_2O_5$, $Y_2O_3$, and $HfO_2$. For example, the glass based article can have the compositions according to Table 1 as described above.

In various embodiments, this disclosure also provides a glass based article characterized by a high Young's modulus value. As understood by those skilled in the art, Young's modulus value can reflect the hardness of the glass based article. In any of the embodiments described herein, the glass based article can have a Young's modulus value of at least 85 GPa (e.g., at least 90 GPa; at least 95 GPa; at least 100 GPa; at least 105 GPa; at least 110 GPa; at least 120 GPa; at least 130 GPa; or at least 140 GPa). For example, the glass based article can have a Young's modulus value of about 85 GPa, about 90 GPa; about 95 GPa; about 100 GPa; about 105 GPa; about 110 GPa; about 120 GPa, about 130 GPa, about 140 GPa, or any ranges between the specified values. In some embodiments, the glass based article has a Young's modulus value of about 85 GPa to about 140 GPa. In some embodiments, the glass based article has a Young's modulus value of about 110 GPa to about 140 GPa. The Young's modulus value recited in this disclosure refers to a value (converted into GPa) as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

In some embodiments, the glass based article characterized by the Young's modulus value described herein comprises $SiO_2$, $Al_2O_3$, and two or more metal oxides selected from the group consisting of $La_2O_3$, BaO, $Ta_2O_5$, $Y_2O_3$, and $HfO_2$. Suitable concentrations of $SiO_2$, $Al_2O_3$, and the two or more metal oxides include any of those described herein. In some embodiments, the glass based article comprises not more than 5 mol % (e.g., not more than 3 mol %, not more than 2 mol %, not more than 1 mol %, not more than 0.5 mol %, or not more than 0.1 mol %) of alkali metals. In some embodiments, the glass based article comprises not more than 5 mol % (e.g., not more than 3 mol %, not more than 2 mol %, not more than 1 mol %, not more than 0.5 mol %, or not more than 0.1 mol %) of boron. In some embodiments, the glass based article comprises not more than 5 mol % (e.g., not more than 3 mol %, not more than 2 mol %, not more than 1 mol %, not more than 0.5 mol %, or not more than 0.1 mol %) of alkali metals and boron. In some embodiments, there are no alkali metals present in the glass based article. In some embodiments, there is no boron present in the glass based article. In some embodiments, there are no alkali metals and boron present in the glass based article. In some embodiments, the glass based article comprises $SiO_2$, $Al_2O_3$, $La_2O_3$, BaO, $Ta_2O_5$, $Y_2O_3$, and $HfO_2$. In some embodiments, the glass based article consists or consists essentially of $SiO_2$, $Al_2O_3$, $La_2O_3$, BaO, $Ta_2O_5$, $Y_2O_3$, and $HfO_2$. For example, the glass based article can have the compositions according to Table 1 as described above.

In various embodiments, this disclosure also provides a glass based article characterized by a low stress optical coefficient (SOC). As understood by those skilled in the art, SOC is related to the birefringence of the glass. In any of the embodiments described herein, the glass based article can have a SOC of not more than 3 Brewster (e.g., not more than 2 Brewster, not more than 1.5 Brewster, or not more than 1 Brewster). In some embodiments, the glass based article has a SOC of about 0.5 Brewster, about 0.7 Brewster, about 0.9 Brewster, about 1.1 Brewster, about 1.3 Brewster, about 1.5 Brewster, about 1.7 Brewster, about 1.9 Brewster, about 2 Brewster, or any ranges between the specified values. In some embodiments, the glass based article has a SOC of about 1.3 Brewster to about 2 Brewster. SOC values can be measured as set forth in Procedure C (Glass Disc Method) of ASTM standard C770-16, entitled "Standard Test Method for Measurement of Glass Stress-Optical Coefficient."

In some embodiments, the glass based article characterized by the SOC value described herein comprises $SiO_2$, $Al_2O_3$, and two or more metal oxides selected from the group consisting of $La_2O_3$, BaO, $Ta_2O_5$, $Y_2O_3$, and $HfO_2$. Suitable concentrations of $SiO_2$, $Al_2O_3$, and the two or more metal oxides include any of those described herein. In some embodiments, the glass based article comprises not more than 5 mol % (e.g., not more than 3 mol %, not more than 2 mol %, not more than 1 mol %, not more than 0.5 mol %, or not more than 0.1 mol %) of alkali metals. In some embodiments, the glass based article comprises not more than 5 mol % (e.g., not more than 3 mol %, not more than 2 mol %, not more than 1 mol %, not more than 0.5 mol %, or not more than 0.1 mol %) of boron. In some embodiments, the glass based article comprises not more than 5 mol % (e.g., not more than 3 mol %, not more than 2 mol %, not more than 1 mol %, not more than 0.5 mol %, or not more than 0.1 mol %) of alkali metals and boron. In some embodiments, there are no alkali metals present in the glass based article. In some embodiments, there is no boron present in the glass based article. In some embodiments, there are no alkali metals and boron present in the glass based article. In some embodiments, the glass based article comprises $SiO_2$, $Al_2O_3$, $La_2O_3$, BaO, $Ta_2O_5$, $Y_2O_3$, and $HfO_2$. In some embodiments, the glass based article consists or consists essentially of $SiO_2$, $Al_2O_3$, $La_2O_3$, BaO, $Ta_2O_5$, $Y_2O_3$, and $HfO_2$. For example, the glass based article can have the compositions according Table 1 as described above:

The glass based article described herein can be characterized by more than one properties of fracture toughness, Young's modulus, and stress optical coefficient. For example, in some embodiments, the glass based article described herein can be characterized by (i) a fracture toughness of at least 0.86 $MPa*m^{0.5}$ (e.g., about 1 $MPa*m^{0.5}$ to about 1.6 $MPa*m^{0.5}$); (ii) a Young's modulus value of at least 85 GPa (e.g., about 110 GPa to about 140 GPa); and/or (iii) a stress optical coefficient (SOC) of not more than 3 Brewster (e.g., about 1.3 Brewster to about 2 Brewster). In any of the embodiments described herein, the glass based article is substantially transparent.

Glass Based Articles with Specific Concentration Requirements

In some embodiments, this disclosure also provides a glass based article comprising $SiO_2$ and two or more oxides of $M_xO_y$, wherein M is Ba, La, Ta, Y, Al or Hf. For example, the two or more oxides of $M_xO_y$ can be selected from the group consisting of $Al_2O_3$, $La_2O_3$, BaO, $Ta_2O_5$, $Y_2O_3$, and $HfO_2$. In some embodiments, the concentrations of the oxides in the glass based article satisfies a relationship such that the combined molar percentage of $SiO_2$ is the same or substantially the same (e.g., within 95%, within 90%, within 85%, or within 80%) as that of a reference glass based article comprising two or more binary compositions of $M_xO_y$—$SiO_2$, wherein the reference glass based article has the same molar percentage of each $M_xO_y$, and the molar ratio of $M_xO_y$ to $SiO_2$ in each binary composition is 4/(c*x), wherein c is the number of charges of M. In other words, the combined concentration of $SiO_2$ is: $[SiO_2]_{total}=\Sigma[M_xO_y]/(4/c*x)$ considering each $M_xO_y$ present in the glass based article. For example, assuming the glass based article includes BaO, $SiO_2$ and $La_2O_3$, the combined amount of $SiO_2$ can be calculated based on the amount of BaO and $La_2O_3$ by the equation $[SiO_2]_{total}=[BaO]/2+[La_2O_3]/0.67$. This equation is based on the assumption that each of BaO and $La_2O_3$ can in theory form a binary composition of BaO—$SiO_2$ and $La_2O_3$—$SiO_2$, wherein in each binary composition, the molar ratio of Ba/La to Si is 4/(c*x), i.e., for Ba, 4/(2*1)=2, and for La, 4/(3*2)=0.67. In some embodiments, the $SiO_2$ is in a total amount of about 30 mol % to about 80 mol % (e.g., about 30 mol %, about 35 mol %, about 40 mol %, about 45 mol %, about 50 mol %, about 55 mol %, about 60 mol %, about 65 mol %, about 70 mol %, about 75 mol %, about 80 mol %, or any ranges between the specified values).

Process of Making

Typically, the glass based article can be prepared by methods involving melting and mixing the individual oxides. However, in some embodiments, "confusion principle" can be employed to maximize mixing entropy, for example, to suppress crystallization.

In some embodiments, this disclosure provides a process of preparing a glass based article. In some embodiments, the glass based article comprising $SiO_2$ and two or more oxides of $M_xO_y$, wherein M is Ba, La, Ta, Y, Al or Hf, for example, the two or more oxides of $M_xO_y$ can be selected from the group consisting of $Al_2O_3$, $La_2O_3$, BaO, $Ta_2O_5$, $Y_2O_3$, and $HfO_2$. In some embodiments, the combined concentration of $SiO_2$ is: $[SiO_2]_{total}=\Sigma[M_xO_y]/(4/c^*x)$ considering each $M_xO_y$ present in the glass based article. In some embodiments, the process comprises mixing two or more binary compositions of $M_xO_y$—$SiO_2$, wherein M is Ba, La, Ta, Y, Al or Hf; and heating the two or more binary compositions of $M_xO_y$—$SiO_2$ to form the glass based article. In some embodiments, the two or more binary compositions of $M_xO_y$—$SiO_2$ can comprise BaO—$SiO_2$, $La_2O_3$—$SiO_2$, $Ta_2O_5$—$SiO_2$, $Y_2O_3$—$SiO_2$, $Al_2O_3$—$SiO_2$ and $HfO_2$—$SiO_2$. In the available relevant binary phase diagrams in the ACerS/NIST Phase Diagram Database, although almost all the eutectic point temperatures are below 1650° C., the eutectic compositions of these metallic oxides with silicon dioxide are generally very limited.

In some embodiments, each binary composition described above is characterized by a molar ratio of $SiO_2$ to $M_xO_y$ of $1:4/(c^*x)$, wherein c is the number of charges of M. For example, in some embodiments, for a binary composition made of $SiO_2$ and an oxide $M_xO_y$, to allow every oxygen atom in a ($SiO_2$) tetrahedron to be bonded to an M ion, four positive charges per ($SiO_2$) tetrahedron needs to be supplied assuming M ions will be solely bonded to oxygen. Thus, the mole ratio of Si to M in such a composition should be $1:(4/c)$, where c is the number of charges M ion carries, and the mole ratio of $SiO_2$ to $M_xO_y$ can be $1:(4/c/x)$. To further illustrate, assuming M is Ta, in a binary composition, the mole ratio of $SiO_2$ to $Ta_2O_5$ can be $1:(4/5/2)=1:0.4$. Similarly, if M is Hf, the mole ratio of $SiO_2$ to $HfO_2$ can be $1:(4/4/1)=1:1$. And if M is Y, the ratio between $SiO_2$ and $Y_2O_3$ can be $1:(4/3/2)=1:0.67$, etc.

In some embodiments, the two or more binary compositions of $M_xO_y$—$SiO_2$ are selected from the group consisting of BaO—$SiO_2$, $La_2O_3$—$SiO_2$, $Ta_2O_5$—$SiO_2$, $Y_2O_3$—$SiO_2$, $Al_2O_3$—$SiO_2$ and $HfO_2$—$SiO_2$. For example, in some embodiments, the two or more binary compositions can comprise two binary compositions, BaO—$SiO_2$ and $La_2O_3$—$SiO_2$; BaO—$SiO_2$ and $Ta_2O_5$—$SiO_2$; BaO—$SiO_2$ and $Y_2O_3$—$SiO_2$; BaO—$SiO_2$ and $Al_2O_3$—$SiO_2$; BaO—$SiO_2$ and $HfO_2$—$SiO_2$; $La_2O_3$—$SiO_2$ and $Ta_2O_5$—$SiO_2$; $La_2O_3$—$SiO_2$ and $Y_2O_3$—$SiO_2$; $La_2O_3$—$SiO_2$ and $Al_2O_3$—$SiO_2$; $La_2O_3$—$SiO_2$ and $HfO_2$—$SiO_2$; $Ta_2O_5$—$SiO_2$ and $Y_2O_3$—$SiO_2$; $Ta_2O_5$—$SiO_2$ and $Al_2O_3$—$SiO_2$; $Ta_2O_5$—$SiO_2$ and $HfO_2$—$SiO_2$; $Y_2O_3$—$SiO_2$ and $Al_2O_3$—$SiO_2$; $Y_2O_3$—$SiO_2$ and $HfO_2$—$SiO_2$; $Al_2O_3$—$SiO_2$ and $HfO_2$—$SiO_2$, three binary compositions, BaO—$SiO_2$, $La_2O_3$—$SiO_2$ and $Ta_2O_5$—$SiO_2$, BaO—$SiO_2$, $La_2O_3$—$SiO_2$ and $Y_2O_3$—$SiO_2$, BaO—$SiO_2$, $La_2O_3$—$SiO_2$ and $Al_2O_3$—$SiO_2$, BaO—$SiO_2$, $La_2O_3$—$SiO_2$ and $HfO_2$—$SiO_2$, BaO—$SiO_2$, $Ta_2O_5$—$SiO_2$ and $Y_2O_3$—$SiO_2$, BaO—$SiO_2$, $Ta_2O_5$—$SiO_2$ and $Al_2O_3$—$SiO_2$, BaO—$SiO_2$, $Ta_2O_5$—$SiO_2$ and $HfO_2$—$SiO_2$, BaO—$SiO_2$, $Y_2O_3$—$SiO_2$ and $Al_2O_3$—$SiO_2$, BaO—$SiO_2$, $Y_2O_3$—$SiO_2$ and $HfO_2$—$SiO_2$, BaO—$SiO_2$, $Al_2O_3$—$SiO_2$ and $HfO_2$—$SiO_2$, $La_2O_3$—$SiO_2$, $Ta_2O_5$—$SiO_2$ and $Y_2O_3$—$SiO_2$, $La_2O_3$—$SiO_2$, $Ta_2O_5$—$SiO_2$ and $Al_2O_3$—$SiO_2$, $La_2O_3$—$SiO_2$, $Ta_2O_5$—$SiO_2$ and $HfO_2$—$SiO_2$, $La_2O_3$—$SiO_2$, $Ta_2O_5$—$SiO_2$ and $Y_2O_3$—$SiO_2$, $La_2O_3$—$SiO_2$, $Ta_2O_5$—$SiO_2$ and $Al_2O_3$—$SiO_2$, $La_2O_3$—$SiO_2$, $Ta_2O_5$—$SiO_2$ and $HfO_2$—$SiO_2$, $La_2O_3$—$SiO_2$, $Y_2O_3$—$SiO_2$ and $Al_2O_3$—$SiO_2$, $La_2O_3$—$SiO_2$, $Y_2O_3$—$SiO_2$ and $HfO_2$—$SiO_2$, $La_2O_3$—$SiO_2$, $Al_2O_3$—$SiO_2$ and $HfO_2$—$SiO_2$, $Ta_2O_5$—$SiO_2$, $Y_2O_3$—$SiO_2$ and $Al_2O_3$—$SiO_2$, $Ta_2O_5$—$SiO_2$, $Y_2O_3$—$SiO_2$ and $HfO_2$—$SiO_2$, $Ta_2O_5$—$SiO_2$, $Al_2O_3$—$SiO_2$ and $HfO_2$—$SiO_2$, $Y_2O_3$—$SiO_2$, $Al_2O_3$—$SiO_2$ and $HfO_2$—$SiO_2$, four binary compositions, BaO—$SiO_2$, $La_2O_3$—$SiO_2$, $Ta_2O_5$—$SiO_2$ and $Y_2O_3$—$SiO_2$, BaO—$SiO_2$, $La_2O_3$—$SiO_2$, $Ta_2O_5$—$SiO_2$ and $Al_2O_3$—$SiO_2$, BaO—$SiO_2$, $La_2O_3$—$SiO_2$, $Ta_2O_5$—$SiO_2$ and $HfO_2$—$SiO_2$, BaO—$SiO_2$, $La_2O_3$—$SiO_2$, $Ta_2O_5$—$SiO_2$, $Y_2O_3$—$SiO_2$ and $Al_2O_3$—$SiO_2$, BaO—$SiO_2$, $Ta_2O_5$—$SiO_2$, $Y_2O_3$—$SiO_2$ and $HfO_2$—$SiO_2$, BaO—$SiO_2$, $Y_2O_3$—$SiO_2$, $Al_2O_3$—$SiO_2$ and $HfO_2$—$SiO_2$, $La_2O_3$—$SiO_2$, $Ta_2O_5$—$SiO_2$, $Y_2O_3$—$SiO_2$ and $Al_2O_3$—$SiO_2$, $La_2O_3$—$SiO_2$, $Ta_2O_5$—$SiO_2$, $Y_2O_3$—$SiO_2$ and $HfO_2$—$SiO_2$, $La_2O_3$—$SiO_2$, $Ta_2O_5$—$SiO_2$, $Al_2O_3$—$SiO_2$ and $HfO_2$—$SiO_2$, $La_2O_3$—$SiO_2$, $Y_2O_3$—$SiO_2$, $Al_2O_3$—$SiO_2$ and $HfO_2$—$SiO_2$, $Ta_2O_5$—$SiO_2$, $Y_2O_3$—$SiO_2$, $Al_2O_3$—$SiO_2$ and $HfO_2$—$SiO_2$, $Y_2O_3$—$SiO_2$, $HfO_2$—$SiO_2$ and $Al_2O_3$—$SiO_2$, five binary compositions, BaO—$SiO_2$, $La_2O_3$—$SiO_2$, $Ta_2O_5$—$SiO_2$, $Y_2O_3$—$SiO_2$ and $Al_2O_3$—$SiO_2$, BaO—$SiO_2$, $La_2O_3$—$SiO_2$, $Ta_2O_5$—$SiO_2$, $Y_2O_3$—$SiO_2$ and $HfO_2$—$SiO_2$, BaO—$SiO_2$, $Ta_2O_5$—$SiO_2$, $Y_2O_3$—$SiO_2$, $HfO_2$—$SiO_2$ and $Al_2O_3$—$SiO_2$, $La_2O_3$—$SiO_2$, $Ta_2O_5$—$SiO_2$, $Y_2O_3$—$SiO_2$, $HfO_2$—$SiO_2$ and $Al_2O_3$—$SiO_2$, or six binary compositions BaO—$SiO_2$, $La_2O_3$—$SiO_2$, $Ta_2O_5$—$SiO_2$, $Y_2O_3$—$SiO_2$, $Al_2O_3$—$SiO_2$ and $HfO_2$—$SiO_2$. In some embodiments, the $SiO_2$ is in a total amount of about 30 mol % to about 80 mol % (e.g., about 30 mol %, about 35 mol %, about 40 mol %, about 45 mol %, about 50 mol %, about 55 mol %, about 60 mol %, about 65 mol %, about 70 mol %, about 75 mol %, about 80 mol %, or any ranges between the specified values).

Different mixing proportions of the binary compositions can be used. For illustration purposes, in some embodiments, the process comprises mixing six binary compositions BaO—$SiO_2$, $La_2O_3$—$SiO_2$, $Ta_2O_5$—$SiO_2$, $Y_2O_3$—$SiO_2$, $Al_2O_3$—$SiO_2$ and $HfO_2$—$SiO_2$.

In such embodiments, one major binary composition up 50 mol % can be used and the remaining binary compositions can constitute the remaining 50 mol %. For example, the ratio between these binary compositions can be 5:1:1:1:1:1. Other ratios can also be used. For example, in some embodiments, two or more major binary compositions can be used, such that the mixing proportions can be, for example, 3:3:1:1:1:1, 7:7:7:3:3:3, 2:2:2:2:1:1 and so on.

In some embodiments, the present disclosure also provides a product produced by any of the processes described herein. In general, these products produced also share the physical property characteristics as described herein.

It is to be understood that in some embodiments, for any of the product produced by using the binary compositions as described herein, corresponding individual (non-binary) oxides can also be used to prepare the glass based articles described herein, so long as the relative amount of the oxides are the same or substantially the same (e.g., within 95%, within 90%, within 85%, or within 80%).

Devices

The glass based articles described herein can have various applications, for example, where a high fracture toughness is desired. Those skilled in the art would understand that the glass based articles described herein can take various shapes, thickness, etc. according to its specific applications.

For example, the glass based articles disclosed herein may be incorporated into another article such as an article with a display (or display articles) (e.g., consumer electronics, including mobile phones, tablets, computers, laptops, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the glass based articles disclosed herein is shown in FIGS.

Figure 1B:
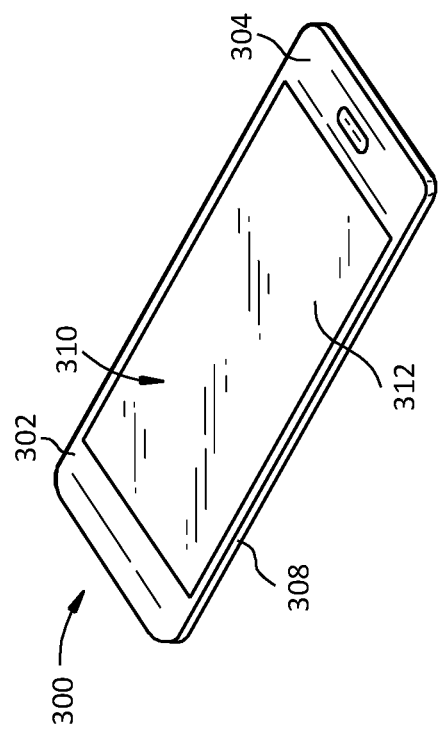
FIG. 1B is a perspective view of the exemplary electronic device of FIG. 1A.

1A and 1B. Specifically, FIGS. 1A and 1B show a consumer electronic device 300 including a housing 302 having front 304, back 306, and side 308 surfaces; electrical components (not shown) that are at least partially inside or entirely within the housing and including at least a controller, a memory, and a display 310 at or adjacent to the front surface of the housing; and a cover substrate 312 at or over the front surface of the housing such that it is over the display. In some embodiments, the cover substrate 312 may include any of the glass based articles disclosed herein.

EXAMPLES

The following examples further illustrate the advantages and features of this disclosure and are in no way intended to limit this disclosure thereto.

Inasmuch as the sum of the individual constituents totals or very closely approximates 100, for all practical purposes the reported values may be deemed to represent mole %. The actual batch ingredients may comprise any materials, either oxides, or other compounds, which, when melted together with the other batch components, will be converted into the desired oxide in the proper proportions. For example, $BaCO_3$ can provide the source of BaO.

The specific batch ingredients used to prepare the glasses of Tables II and III were $SiO_2$, $Al_2O_3$, $La_2O_3$, BaO, $Ta_2O_5$, $Y_2O_3$, and $HfO_2$.

TABLE II

Example glasses made in experiment. mol %

| | Sample No. | | | | | |
|---|---|---|---|---|---|---|
| | 1 | 2 | 3 | 4 | 5 | 6 |
| SiO2 | 55.0 | 59.3 | 45.3 | 54.9 | 50.0 | 46.2 |
| BaO | 14.1 | 4.0 | 6.9 | 14.3 | 6.1 | 13.3 |
| La2O3 | 13.0 | 12.5 | 15.2 | 4.7 | 11.1 | 6.2 |
| Ta2O5 | 4.4 | 4.0 | 16.5 | 4.5 | 12.3 | 12.8 |
| Y2O3 | 4.4 | 12.1 | 4.3 | 12.7 | 9.8 | 9.8 |
| Al2O3 | 4.6 | 4.1 | 9.7 | 4.6 | 7.9 | 8.5 |
| HfO2 | 4.4 | 4.0 | 2.0 | 4.4 | 2.9 | 3.3 |
| Total | 100.0 | 100.0 | 100.0 | 100.0 | 100.0 | 100.0 |
| Density (g/cm 3) | 4.795 | 4.702 | 5.463 | 4.636 | 5.15 | 5.062 |
| Poisson's Ratio | 0.283 | 0.285 | 0.281 | 0.278 | 0.274 | 0.271 |
| Calculated Poisson's | 0.282 | 0.286 | 0.282 | 0.277 | 0.274 | 0.270 |
| Shear Modulus (Mpsi) | 5.74 | 6.31 | 6.53 | 5.98 | 6.56 | 6.39 |
| Young's Modulus (Mpsi) | 14.72 | 16.23 | 16.74 | 15.27 | 16.71 | 16.23 |
| Shear Modulus (GPa) | 39.6 | 43.5 | 45.0 | 41.2 | 45.2 | 44.1 |
| Young's Modulus (GPa) | 101.5 | 111.9 | 115.4 | 105.3 | 115.2 | 111.9 |
| Annealing Point (C) | 870.6 | 882.4 | 860.1 | 884.7 | 866.5 | 867.3 |
| Strain Point (C) | 830.5 | 843.3 | 821.5 | 843.8 | 827.6 | 826.7 |
| Softening Point (C) | 1017.9 | 1018.8 | 1001.6 | 1030.4 | 1010 | 1010.2 |
| Fracture toughness ($K_{1C}$) | 0.973 | 1.047 | 1.147 | 1.012 | 1.172 | 1.089 |
| $K_{1C}$ Standard deviation | 0.049 | 0.042 | 0.108 | 0.023 | 0.018 | 0.096 |
| SOC | 1.545 | 1.592 | 1.969 | 1.812 | 2.017 | 2.143 |

TABLE II-continued

Example glasses made in experiment. mol %

| | Sample No. | | | | | |
|---|---|---|---|---|---|---|
| | 1 | 2 | 3 | 4 | 5 | 6 |
| CTE (ppm/K) | 6.9 | 6 | 6.17 | 6.35 | 5.57 | 6.19 |

TABLE III

Example glasses made in experiment. mol %

| | Sample No. | | | | | |
|---|---|---|---|---|---|---|
| | 7 | 8 | 9 | 10 | 11 | 12 |
| SiO2 | 46.9 | 48.9 | 67.4 | 50.9 | 59.3 | 58.8 |
| BaO | 12.8 | 10.6 | 16.4 | 24.5 | 4.1 | 4.1 |
| La2O3 | 11.6 | 10.2 | 3.2 | 4.8 | 20.4 | 4.1 |
| Ta2O5 | 12.9 | 10.9 | 3.2 | 4.8 | 4.0 | 4.1 |
| Y2O3 | 4.6 | 8.8 | 3.2 | 5.1 | 4.0 | 20.6 |
| Al2O3 | 8.1 | 7.2 | 3.3 | 4.9 | 4.1 | 4.1 |
| HfO2 | 3.1 | 3.4 | 3.2 | 4.9 | 4.1 | 4.1 |
| Total | 100.0 | 100.0 | 100.0 | 100.0 | 100.0 | 100.0 |
| Density (g/cm 3) | 5.232 | 5.054 | 3.958 | 4.716 | 4.898 | 4.514 |
| Poisson's Ratio | 0.277 | 0.276 | 0.248 | 0.27 | 0.292 | 0.28 |
| Calculated Poisson's | 0.277 | 0.276 | 0.247 | 0.269 | 0.292 | 0.28 |
| Shear Modulus (Mpsi) | 6.25 | 6.32 | 5.2 | 5.58 | 6.03 | 6.55 |
| Young's Modulus (Mpsi) | 15.96 | 16.13 | 12.97 | 14.16 | 15.58 | 16.77 |
| Shear Modulus (GPa) | 43.1 | 43.6 | 35.9 | 38.5 | 41.6 | 45.3 |
| Young's Modulus (GPa) | 110.0 | 111.2 | 89.4 | 97.6 | 107.4 | 109.1 |
| Annealing Point (C) | 862.4 | 865.4 | 851.1 | 870.1 | 873.9 | 894.5 |
| Strain Point (C) | 821.8 | 825.3 | 805.9 | 827.4 | 836.3 | 855.5 |
| Softening Point (C) | 1008 | 1008.2 | 1030 | 1021.4 | 1010.3 | 1030.6 |
| Fracture toughness ($K_{1C}$) | 1.032 | 1.57443* | 0.969 | 0.873 | 1.008 | 1.079 |
| $K_{1C}$ Standard deviation | 0.101 | 0.26635 | 0.045 | 0.03 | 0.003 | 0.025 |
| SOC | 1.926 | 1.959 | 2.395 | 1.728 | 1.335 | 1.82 |
| CTE (ppm/K) | 6.39 | 6.22 | 5.72 | 7.1 | 6.72 | 5.99 |

*improper break for al 7 samples

For examples 1-6 listed in Table II, and examples 7-12 listed in Table III, raw materials containing each of the individual oxides are mixed and melted to obtain the respective compositions. Compositions and physical properties were obtained via standard physical/chemical methods, and as described below.

The glass properties set forth in Table II and III were determined in accordance with techniques conventional in the glass art. Thus, the linear coefficient of thermal expansion (CTE) over the temperature range 0-300° C. is expressed in terms of ppm/K and was determined from fiber elongation technique, ASTM reference E228-11. The density was determined using the buoyancy method of ASTM C693-93(2013). Young's modulus values in terms of Mpsi (or GPa), shear modulus values in terms of Mpsi (or GPa), and Poisson's ratio were determined using a resonant ultrasonic spectroscopy technique of the general type set forth in ASTM E2001-13. The annealing point and strain point were determined using the beam bending viscosity method of ASTM C598-93(2013). The softening point was determined using the parallel plate viscosity method of ASTM C338-93(2013). Stress optical coefficient (SOC) values can be measured by Procedure C (Glass Disc Method) of ASTM standard C770-16

Fracture Toughness ($K_{1C}$ [MPa*m$^{0.5}$]) was determined using the method described above.

In an aspect (1), a glass based article comprises:
SiO$_2$ in the range of about 35 mol % to about 80 mol %;
Al$_2$O$_3$ in the range of about 1 mol % to about 15 mol %; and
two or more metal oxides selected from the group consisting of La$_2$O$_3$, BaO, Ta$_2$O$_5$, Y$_2$O$_3$, and HfO$_2$, wherein the combined molar percentages of the two or more metal oxides are at least 15 mol %.

An aspect (2) according to aspect (1), comprising HfO$_2$ in the range of about 1 mol % to about 7 mol %.

An aspect (3) according to any preceding aspect, comprising Y$_2$O$_3$ in the range of about 1 mol % to about 29 mol %.

An aspect (4) according to any preceding aspect, comprising Ta$_2$O$_5$ in the range of about 1 mol % to about 30 mol %.

An aspect (5) according to any preceding aspect, comprising La$_2$O$_3$ in the range of about 1 mol % to about 29 mol %.

An aspect (6) according to any preceding aspect, comprising BaO in the range of about 1 mol % to about 33 mol %.

An aspect (7) according to any preceding aspect, comprising:
SiO$_2$ in the range of about 40 mol % to about 75 mol %;
Al$_2$O$_3$ in the range of about 3 mol % to about 10 mol %;
La$_2$O$_3$ in the range of about 2 mol % to about 25 mol %;
Ta$_2$O$_5$ in the range of about 2 mol % to about 20 mol %;
Y$_2$O$_3$ in the range of about 2 mol % to about 21 mol %;
HfO$_2$ in the range of about 1.5 mol % to about 6 mol %; and
BaO in the range of about 2 mol % to about 25 mol %.

An aspect (8) according to any preceding aspect, comprising:
SiO$_2$ in the range of about 45 mol % to about 70 mol %;
Al$_2$O$_3$ in the range of about 4 mol % to about 9 mol %;
La$_2$O$_3$ in the range of about 4 mol % to about 22 mol %;
Ta$_2$O$_5$ in the range of about 2.5 mol % to about 18 mol %;
Y$_2$O$_3$ in the range of about 4 mol % to about 21 mol %;
HfO$_2$ in the range of about 2 mol % to about 5 mol %; and
BaO in the range of about 4 mol % to about 25 mol %.

An aspect (9) according to any preceding aspect, comprising not more than 5 mol % of alkali metals.

An aspect (10) according to any preceding aspect, comprising not more than 5 mol % of boron.

An aspect (11) according to any preceding aspect, characterized by having (i) a fracture toughness of at least 0.86 MPa*m$^{0.5}$; (ii) a Young's modulus value of at least 85 GPa; and/or (iii) a stress optical coefficient (SOC) of not more than 3 Brewster.

In an aspect (12), a glass based article comprises:
SiO$_2$, Al$_2$O$_3$, and two or more metal oxides selected from the group consisting of La$_2$O$_3$, BaO, Ta$_2$O$_5$, Y$_2$O$_3$, and HfO$_2$,
wherein the glass based article is characterized by a fracture toughness of at least 0.86 MPa*m$^{0.5}$.

An aspect (13) according to aspect (12), wherein the glass based article comprises not more than 5 mol % of alkali metals and boron.

An aspect (14) according to an aspect (12) or (13), wherein the two or more metal oxides comprise La$_2$O$_3$, BaO, Ta$_2$O$_5$, Y$_2$O$_3$, and HfO$_2$.

An aspect (15) according to any one of aspect (12)-(14), wherein the glass based article has (i) a fracture toughness of about 1.0 MPa*m$^{0.5}$ to about 1.6 MPa*m$^{0.5}$; (ii) a Young's modulus value of about 110 GPa to about 140 GPa; and/or (iii) a stress optical coefficient (SOC) of about 1.3 Brewster to about 2 Brewster.

In an aspect (16), a glass based article comprises:
SiO$_2$ and two or more of M$_x$O$_y$, wherein M is Ba, La, Ta, Y, Al or Hf;
wherein the total amount of SiO$_2$ is the same or substantially the same as that of a reference glass based article comprising two or more binary compositions of M$_x$O$_y$—SiO$_2$, wherein the reference glass based article has the same molar percentage of each M$_x$O$_y$, and the molar ratio of M$_x$O$_y$ to SiO$_2$ in each binary composition is 4/(c*x), wherein c is the number of charges of M.

In an aspect (17), a process for preparing the glass based article of aspect (16), comprising:
mixing two or more binary compositions of M$_x$O$_y$—SiO$_2$, wherein M is Ba, La, Ta, Y, Al or Hf; and
heating the two or more binary compositions of M$_x$O$_y$—SiO$_2$ to form the glass based article.

An aspect (18) according to aspect (17), wherein the two or more binary compositions of M$_x$O$_y$—SiO$_2$ comprise BaO—SiO$_2$, La$_2$O$_3$—SiO$_2$, Ta$_2$O$_5$—SiO$_2$, Y$_2$O$_3$—SiO$_2$, Al$_2$O$_3$—SiO$_2$ and HfO$_2$—SiO$_2$, and wherein the SiO$_2$ is in a total amount of about 30 mol % to about 80 mol %.

In an aspect (19), a glass based article prepared by the process of aspect (17) or (18).

In an aspect (20), A consumer electronic device comprises a glass based article of any one of aspects (1)-(16) and (19).

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments.

All of the various aspects, embodiments, and options described herein can be combined in any and all variations.

All publications, patents, and patent applications mentioned in this specification are herein incorporated by reference to the same extent as if each individual publication, patent, or patent application was specifically and individually indicated to be incorporated by reference.

What is claimed:
1. A glass based article comprising:
SiO$_2$ in the range of 35 mol % to 80 mol %;
Al$_2$O$_3$ in the range of 1 mol % to 15 mol %;

alkali metals in the range of 0 mol % to 5 mol % of total alkali metals, collectively; and two or more metal oxides selected from the group consisting of $La_2O_3$, BaO, $Ta_2O_5$, $Y_2O_3$, and $HfO_2$, wherein the combined molar percentages of the two or more metal oxides are at least 15 mol %, and wherein the glass based article has a fracture toughness of at least 0.86 $MPa*m^{0.5}$.

2. The glass based article of claim 1, comprising $HfO_2$ in the range of 1 mol % to 7 mol %.

3. The glass based article of claim 1, comprising $Y_2O_3$ in the range of 1 mol % to 29 mol %.

4. The glass based article of claim 1, comprising $Ta_2O_5$ in the range of 1 mol % to 30 mol %.

5. The glass based article of claim 1, comprising $La_2O_3$ in the range of 1 mol % to 29 mol %.

6. The glass based article of claim 1, comprising BaO in the range of 1 mol % to 33 mol %.

7. The glass based article of claim 1, comprising 0 mol % to 5 mol % of boron.

8. The glass based article of claim 1, wherein there are no alkali metals present in the glass based article.

9. The glass based article of claim 1, comprising:
$SiO_2$ in the range of 10 mol % to 75 mol %;
$Al_2O_3$ in the range of 3 mol % to 10 mol %;
$La_2O_3$ in the range of 2 mol % to 25 mol %;
$Ta_2O_5$ in the range of 2 mol % to 20 mol %;
$Y_2O_3$ in the range of 2 mol % to 21 mol %;
$HfO_2$ in the range of 1.5 mol % to 6 mol %; and
BaO in the range of 2 mol % to 25 mol %.

10. The glass based article of claim 1, comprising:
$SiO_2$ in the range of 15 mol % to 70 mol %;
$Al_2O_3$ in the range of 4 mol % to 9 mol %;
$La_2O_3$ in the range of 4 mol % to 22 mol %;
$Ta_2O_5$ in the range of 2.5 mol % to 18 mol %;
$Y_2O_3$ in the range of 1 mol % to 21 mol %;
$HfO_2$ in the range of 2 mol % to 5 mol %; and
BaO in the range of 1 mol % to 25 mol %.

11. The glass based article of claim 1, characterized by having (i) a Young's modulus value of at least 85 GPa; and/or (ii) a stress optical coefficient (SOC) of not more than 3 Brewster.

12. A consumer electronic device comprising a glass based article of claim 1.

13. The consumer electronic device of claim 12, further comprising a display and a cover substrate disposed over the display, the cover substrate comprising the glass based article.

14. A glass based article comprising:
$SiO_2$,
$Al_2O_3$,
two or more metal oxides selected from the group consisting of $La_2O_3$, BaO, $Ta_2O_5$, $Y_2O_3$, and $HfO_2$, and
0 mol % to 5 mol % of total alkali metals and boron, collectively,
wherein the glass based article is characterized by a fracture toughness of at least 0.86 $MPa*m^{0.5}$.

15. The glass based article of claim 14, wherein there are no alkali metals and no boron present in the glass based article.

16. The glass based article of claim 14, wherein the said metal oxides consist of $La_2O_3$, BaO, $Ta_2O_5$, $Y_2O_3$, and $HfO_2$.

17. The glass based article of claim 14, wherein the glass based article has (i) a fracture toughness of 1.0 $MPa*m^{0.5}$ to 1.6 $MPa*m^{0.5}$; (ii) a Young's modulus value of 110 GPa to 140 GPa; and/or (iii) a stress optical coefficient (SOC) of 1.3 Brewster to 2 Brewster.

18. A consumer electronic device comprising a glass based article of claim 14.

19. The consumer electronic device of claim 18, further comprising a display and a cover substrate disposed over the display, the cover substrate comprising the glass based article.

* * * * *

UNITED STATES PATENT AND TRADEMARK OFFICE
CERTIFICATE OF CORRECTION

PATENT NO. : 10,427,972 B2
APPLICATION NO. : 15/650152
DATED : October 1, 2019
INVENTOR(S) : Jian Luo et al.

It is certified that error appears in the above-identified patent and that said Letters Patent is hereby corrected as shown below:

In the Claims

Column 17, Line 24, Claim 9, delete "10 mol%" and insert -- 40 mol% --, therefor.

Column 17, Line 32, Claim 10, delete "15 mol%" and insert -- 45 mol% --, therefor.

Column 17, Line 36, Claim 10, delete "1 mol%" and insert -- 4 mol% --, therefor.

Column 17, Line 38, Claim 10, delete "1 mol%" and insert -- 4 mol% --, therefor.

Signed and Sealed this
Fourteenth Day of April, 2020

Andrei Iancu
*Director of the United States Patent and Trademark Office*